US006788170B1

(12) United States Patent
Kaitila et al.

(10) Patent No.: US 6,788,170 B1
(45) Date of Patent: Sep. 7, 2004

(54) RESONATOR STRUCTURE HAVING A DAMPENING MATERIAL AND A FILTER HAVING SUCH A RESONATOR STRUCTURE

(75) Inventors: Jyrki A. Kaitila, Helsinki (FI); Markku Ylilammi, Espoo (FI); Juha Ellä, Halikko (FI)

(73) Assignee: Nokia Corporation, Espoo (FI)

( * ) Notice: Subject to any disclaimer, the term of this patent is extended or adjusted under 35 U.S.C. 154(b) by 80 days.

(21) Appl. No.: 10/031,533

(22) PCT Filed: Jul. 18, 2000

(86) PCT No.: PCT/FI00/00652
§ 371 (c)(1),
(2), (4) Date: Apr. 16, 2002

(87) PCT Pub. No.: WO01/06646
PCT Pub. Date: Jan. 25, 2001

(30) Foreign Application Priority Data

Jul. 19, 1999 (FI) ................................. 991619

(51) Int. Cl.⁷ ................................. H03H 9/54
(52) U.S. Cl. ................. 333/187; 333/189; 310/326
(58) Field of Search ............... 333/186–192, 333/133; 310/312, 326

(56) References Cited

U.S. PATENT DOCUMENTS 5,373,268 A 12/1994 Dworsky et al. ........... 333/187
6,150,703 A * 11/2000 Cushman et al. ........... 257/415

FOREIGN PATENT DOCUMENTS

DE 19922146 A1 12/1999
EP 0834989 A2 4/1998
EP 0962999 A2 12/1999
EP 0963000 A2 12/1999
JP 59-67712 * 4/1984 ........... 333/195

OTHER PUBLICATIONS

Japanese Patent document No.: JP 9181560.
Japanese Patent document No.: JP 11191722.
Japanese Patent document No.: JP 10093384.
Japanese Patent document No.: JP 6232688.
Japanese Patent document No.: JP 11135852.
"Acoustic Bulk Wave Composite Resonators", Lakni et al, Feb. 1981, Applied Physics Letters, vol. 38, No. 3, pp. 125–127.
"An Air–Gap Type Piezoelectric Composite Thin Film Resonator", Hiroaki Satoh et al., 1985, 15 Proc. 39th Annual Symp. Freq. Control, pp. 361–366.
"Thin Film Bulk Acoustic Wave Filters for GPS", Lakin et al., 1992 Ultrasonic Symposium, pp. 471–476.

* cited by examiner

Primary Examiner—Barbara Summons
(74) Attorney, Agent, or Firm—Perman & Green, LLP

(57) ABSTRACT

Resonator structure (600, 800, 810, 820) comprises two conductor layers (110, 120) and a piezoelectric layer (100) in between the conductor layers, and said conductor layers and piezoelectric layer extend over a first area of the resonator structure, which first area is a piezoelectrically excitable area of the resonator structure. The resonator structure is characterized in that it is arranged to have a zone (603, 801, 803, 804), which confines a center area (604, 802) within the first area of the resonator, and the layer structure in the zone is arranged to be such that piezoelectrically excited vibrations are dampened more effectively in the zone than in the center area.

10 Claims, 4 Drawing Sheets

RESONATOR STRUCTURE HAVING A DAMPENING MATERIAL AND A FILTER HAVING SUCH A RESONATOR STRUCTURE

This application claims the benefit of the earlier filed International Application No. PCT/FI00/00652, International Filing Date, Jul. 18, 2000, which designated the United States of America, and which international application was published under PCT Article 21(2) in English as WO Publication No. WO 01/06646 A1.

BACKGROUND OF THE INVENTION

The invention relates in general to piezoelectric resonators and filter comprising piezoelectrical resonators. In particular, the invention relates to a resonator structure having a simple structure and good electrical response at the operation frequency.

The development of mobile telecommunications continues towards ever smaller and increasingly complicated handheld units. The development leads to increasing requirements on the miniaturization of the components and structures used in the mobile communication means. This development concerns radio frequency (RF) filter structures as well, which despite the increasing miniaturization should be able to withstand considerable power levels, have very steep passband edges, and low losses.

The RF filters used in prior art mobile phones are often discrete surface acoustic wave (SAW) filters or ceramic filters. Bulk acoustic wave (BAW) resonators are not yet in widespread use, but they have some advantages compared to SAW resonators. For example, BAW structures have a better tolerance of high power levels.

It is known to construct thin film bulk acoustic wave resonators on semiconductor wafers, such as silicon (Si) or gallium arsenide (GaAs) wafers. For example, in an article entitled "Acoustic Bulk Wave Composite Resonators", Applied Physics Letters, Vol 38, No. 3, pp. 125–127, Feb. 1, 1981, by K. M. Lakin and J. S. Wang, an acoustic bulk wave resonator is disclosed which comprises a thin film piezoelectric layer of zinc oxide (ZnO) sputtered over a thin membrane of silicon (Si). Further, in an article entitled "An Air-Gap Type Piezoelectric Composite Thin Film Resonator", I5 Proc. 39th Annual Symp. Freq. Control, pp. 361–366, 1985, by Hiroaki Satoh, Yasuo Ebata, Hitoshi Suzuki, and Choji Narahara, a bulk acoustic wave resonator having a bridge structure is disclosed.

FIG. 1 shows one example of a bulk acoustic wave resonator having a bridge structure. The structure comprises a membrane 130 deposited on a substrate 200. The resonator further comprises a bottom electrode 110 on the membrane, a piezoelectric layer 100, and a top electrode 120. A gap 210 is created between the membrane and the substrate by etching away some of the substrate from the top side. The gap serves as an acoustic isolator, essentially isolating the vibrating resonator structure from the substrate.

In the following, certain types of BAW resonators are first described.

Bulk acoustic wave resonators are typically fabricated on silicon (Si), gallium arsenide (GaAs), glass, or ceramic substrates. One further ceramic substrate type used is alumina. The BAW devices are typically manufactured using various thin film manufacturing techniques, such as for example sputtering, vacuum evaporation or chemical vapor deposition. BAW devices utilize a piezoelectric thin film layer for generating the acoustic bulk waves. The resonance frequencies of typical BAW devices range from 0.5 GHz to 5 GHz, depending on the size and material of the device. BAW resonators exhibit the typical series and parallel resonances of crystal resonators. The resonance frequencies are determined mainly by the material of the resonator and the dimensions of the layers of the resonator.

A typical BAW resonator consists of three basic elements:
an acoustically active piezoelectric layer,
electrodes on opposite sides of the piezoelectric layer, and
acoustical isolation from the substrate.

The piezoelectric layer may be for example, ZnO, AlN, ZnS or any other piezoelectric material that can be fabricated as a thin film. As a further example, also ferroelectric ceramics can be used as the piezoelectric material. For example, $PbTiO_3$ and $Pb(Zr_xTi_{1-x})O_3$ and other members of the so called lead lanthanum zirconate titanate family can be used.

The material used to form the electrode layers is an electrically conductive material. The electrodes may be comprised of for example any suitable metal, such as tungsten (W), aluminum (Al), copper (Cu), molybdenum (Mo), nickel (Ni), titanium (Ti), niobium (Nb), silver (Ag), gold (Au), and tantalum (Ta). The substrate is typically composed of for example Si, $SiO_2$, GaAs, glass, or ceramic materials.

The acoustical isolation can be produced with for example the following techniques:
with a substrate via-hole,
with a micromechanical bridge structure, or
with an acoustic mirror structure.

In the via-hole and bridge structures, the acoustically reflecting surfaces are the air interfaces below and above the devices. The bridge structure is typically manufactured using a sacrificial layer, which is etched away to produce a free-standing structure. Use of a sacrificial layer makes it possible to use a wide variety of substrate materials, since the substrate does not need to be modified very much, as in the via-hole structure. A bridge structure can also be produced using an etch pit structure, in which case a pit has to be etched in the substrate or the material layer below the BAW resonator in order to produce the free standing bridge structure.

FIG. 2 illustrates one example of various ways of producing a bridge structure. Before the deposition of other layers of the BAW structure, a sacrificial layer 135 is deposited and patterned first The rest of the BAW structure is deposited and patterned partly on top of the sacrificial layer 135. After the rest of the BAW structure is completed, the sacrificial layer 135 is etched away. FIG. 3 shows also the substrate 200, a membrane layer 130, the bottom electrode 110, the piezoelectric layer 100, and the top electrode 120. The sacrificial layer can be realized using for example ceramic, metallic or polymeric material.

In the via-hole structure, the resonator is acoustically isolated from the substrate by etching away the substrate from under a major portion of the BAW resonator structure. FIG. 3 shows a via-hole structure of a BAW resonator. FIG. 4 shows the substrate 200, a membrane layer 130, the bottom electrode 110, the piezoelectric layer 100, and the top electrode 120. A via-hole 211 has been etched through the whole substrate. Due to the etching required, via-hole structures are commonly realized only with Si or GaAs substrates.

A further way to isolate a BAW resonator from the substrate is by using an acoustical mirror structure. The acoustical mirror structure performs the isolation by reflecting the acoustic wave back to the resonator structure. An acoustical mirror typically comprises several layers having a thickness of one quarter wavelength at the center frequency, alternating layers having differing acoustical impedances. The number of layers in an acoustic mirror is typically ranging from three to nine. The ratio of acoustic impedance of two consecutive layers should be large in order to present as low acoustic impedance as possible to the BAW resonator, instead of the relatively high impedance of the substrate material. In the case of a piezoelectric layer that is one quarter of the wavelength thick, the mirror layers are chosen so that as high acoustic impedance as possible is presented to the resonator. This is disclosed in U.S. Pat. No. 5,373,268. The material of the high impedance layers can be for example gold (Au), molybdenum (Mo), or tungsten (W), and the material of the low impedance layers can be for example silicon (Si), polysilicon (poly-Si), silicon dioxide ($SiO_2$), aluminum (Al), or a polymer. Since in structures utilizing an acoustical mirror structure, the resonator is isolated from the substrate and the substrate is not modified very much, a wide variety of materials can be used as a substrate. The polymer layer may be comprised of any polymer material having a low loss characteristic and a low acoustic impedance. Preferably, the polymer material is such that it can withstand temperatures of at least 350° C., since relatively high temperatures may be needed during deposition of other layers of the acoustical mirror structure and other structures. The polymer layer may be comprised of by example, polyimide, cyclotene, a carbon-based material, a silicon-based material or any other suitable material.

FIG. 4 shows an example of a BAW resonator on top of an acoustical mirror structure. FIG. 4 shows the substrate 200, the bottom electrode 110, the piezoelectric layer 100, and the top electrode 120. The acoustical mirror structure 150 comprises in this example three layers 150a, 150b. Two of the layers 150a are formed of a first material and the third layer 150b in between the two layers is formed from a second material. The first and second materials have different acoustical impedances as described previously. The order of the materials can be varied. For example, the material with a high acoustical impedance can be in the middle and the material with a low acoustical impedance on both sides of the middle material, or vice versa. The bottom electrode may also be used as one layer of the acoustical mirror.

FIG. 5 shows a further example of a BAW resonator structure. The BAW resonator illustrated in FIG. 5 is a stacked resonator structure having two piezoelectric layers 100. In addition to the bottom 110 and top 120 electrodes, a stacked structure requires a middle electrode 115, which is connected to ground potential. FIG. 6 further shows the membrane layer 130, the substrate 200 and the etch pit 210 isolating the structure from the substrate.

The cut-off frequency for a resonator is determined by assuming that the crystal resonator is infinite in the lateral direction. It is thus determined directly by the material of the layers in the resonator structure and by the thickness of the layers. The cut-off frequency is the mechanical resonance frequency of a laterally infinite plate.

The lateral dimensions of the resonator (or any plate) cause lateral resonance modes to emerge, and the basic resonance frequency of a resonator or that of a finite plate is somewhat higher or lower than its cut-off frequency. This fundamental lateral resonance mode or, in other words, the first mode lateral resonance corresponds to a situation, where there is an amplitude maximum in the middle of the resonator area.

In a finite plate there can be various mechanical vibrations, and any lateral resonance modes can be excited mechanically. Certain lateral resonance modes may be excited piezoelectrically, when an alternating voltage is exerted over the crystal. These lateral resonance modes that are usually at different frequencies cause the surface of the resonator to oscillate. The piezoelectrically excited strongest resonance mode is called the main mode and the other piezoelectrically excited modes are called spurious resonance modes. The spurious resonance modes usually occur at somewhat lower and/or higher frequencies than the cut-off frequency of a resonator.

One of the desired properties of a filter is that at the frequencies which the filter passes, the response of the filter is as even as possible. The variations in the frequency response are called the ripple. The frequency response of a filter should thus be constant, for example in a bandpass filter, over the bandwidth of the filter. In the blocking frequencies the ripple is usually not a problem.

The problem with the spurious resonance modes of crystal resonators and, for example, BAW resonators is that the ripple in filters that are constructed using these resonators is at least partly caused by spurious resonance modes of the resonators. This is discussed, for example, in an article entitled "Thin film bulk acoustic wave filters for GPS", in 1992 Ultrasonic Symposium, pp. 471–476, by K. M Lakin, G. R. Kline and K. T. McCarron. The spurious resonance modes deteriorate the properties of systems that comprise crystal resonators or BAW resonators. The ripple in a frequency response of a filter is one example of the effect of the spurious resonances.

SUMMARY OF THE INVENTION

An object of the invention is to provide a resonator structure. A further object is to provide a resonator structure having good electrical response. A further object of the invention is to provide a resonator structure that is easy to manufacture.

Objects of the invention are achieved by dampening the piezoelectrically excited wave near the edge of the piezoelectrically excitable area.

A resonator structure according to the invention is a resonator structure comprising two conductor layers and a piezoelectric layer in between the conductor layers, said conductor layers and piezoelectric layer extending over a first area of the resonator structure, which first area is a piezoelectrically excitable area of the resonator structure, and it is characterized in that the resonator structure is arranged to have a zone, which confines a center area within the first area of the resonator, and the layer structure in the zone is arranged to be such that piezoelectrically excited vibrations are dampened more effectively in the zone than in the center area.

A filter according to the invention is a filter comprising at least one resonator structure, which comprises two conductor layers and a piezoelectric layer in between the conductor layers, said conductor layers and piezoelectric layer extending over a first area of the resonator structure, which first area is a piezoelectrically excitable area of the resonator structure, and it is characterized in that the resonator structure is arranged to have a zone, which confines a center area, within the first area of the resonator, and the layer structure in the zone is arranged to be such that piezoelectrically excited vibrations are dampened more effectively in the zone than in the center area.

A resonator structure according to the invention comprises two conductive layers and a piezoelectric layer between the conductive layers. The conductive layers form the electrodes of the resonator. The piezoelectric layer may be a piezoelectric crystal or it may be a thin-film layer of piezoelectric material.

An electrically excitable area of a resonator refers here to the area to which all the electrode layers and the piezoelectric layer(s) of the resonator extend. In a resonator structure according to the invention, there is a dampening zone that encircles a certain part of the electrically excitable area of the resonator. Term center area refers here to this part of the electrically excitable area, which is inside the dampening zone. The center area does not have to be, for example, in the center of the resonator area. The dampening zone may be partly or wholly inside the piezoelectrically excitable area or it may be just outside the piezoelectrically excitable are. In the last option to piezoelectrically excitable area forms the center area, in the other options a certain part of the piezoelectrically excitable area forms the center area.

Dampening at the edge of the piezoelectrically excitable area suppresses higher order lateral frequency modes, which are related to the spurious resonances. A relatively larger part of the wave of higher order lateral resonance modes than of the first order lateral resonance mode is confined to the edge of the piezoelectrically excitable area. Therefore modification of the properties of the edge of the piezoelectrically excitable area affects more the higher order lateral resonance modes.

A zone that attenuates vibration better than a center area it confines can be constructed, for example, by having a dampening layer, which has an opening within the piezoelectrically excitable area of the resonator. The opening defines the center area of the resonator. The dampening layer may be, for example, a frame-like layer, in such a frame-like layer the opening in the dampening layer, which defines the center area, is quite large compared to the total area of the dampening layer. The dampening layer may be, for example, a layer of lossy material and it may be located as any layer of the layer structure. It may be, for example, on top of the top electrode, below the bottom electrode or between the piezoelectric layer and an electrode.

The shape of the piezoelectrically excitable area of the resonator or that of the center area (for example, the shape of the opening in a dampening layer) is not restricted to any particular shape in a resonator structure according to the invention. For example, rectangular, oval or circular center areas are possible, as well as any other shapes. The width of the dampening zone need not be uniform. Typically the opening in the dampening layer has similar shape than the piezoelectrically excitable area of the resonator, but the size of the opening a somewhat smaller than that of the piezoelectrically excitable area.

The resonator structure according to the invention enhances the properties of convectional crystal resonators and especially the properties of Thin-film BAW resonators. The properties of the prior-art BAW resonator types, for example of BAW those resonator types discussed above, can be enhanced by modifying the structures according to the invention. Further, when the properties of the resonators are enhanced, the properties of the components that comprise resonators are improved. Specifically, it is advantageous to manufacture filter using the resonator structures according to the invention. Such filters may be used, for example, in mobile communication devices.

BRIEF DESCRIPTION OF THE DRAWING

The invention will now be described more in detail with reference to the preferred embodiments by the way of example and to the accompanying drawings where.

DETAILED DESCRIPTION OF THE INVENTION

Figure 1:
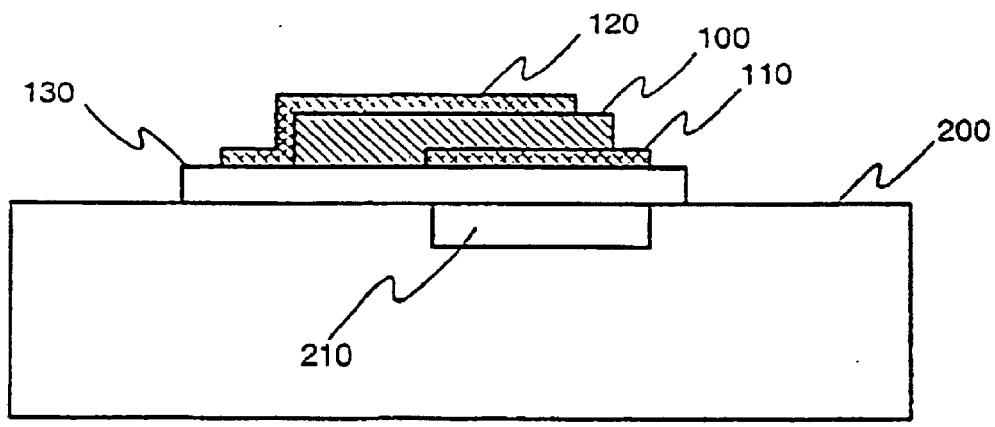
FIG. 1 illustrates a bulk acoustic wave resonator according to prior art.
Figure 2:
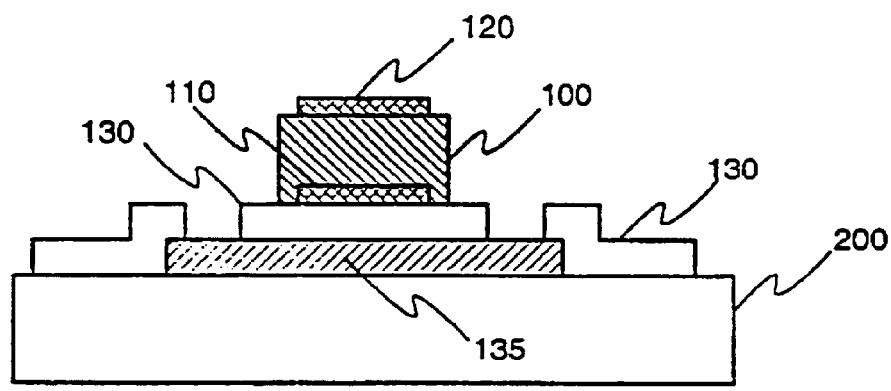
FIG. 2 shows another bulk acoustic wave resonator structure having a bridge structure.
Figure 3:
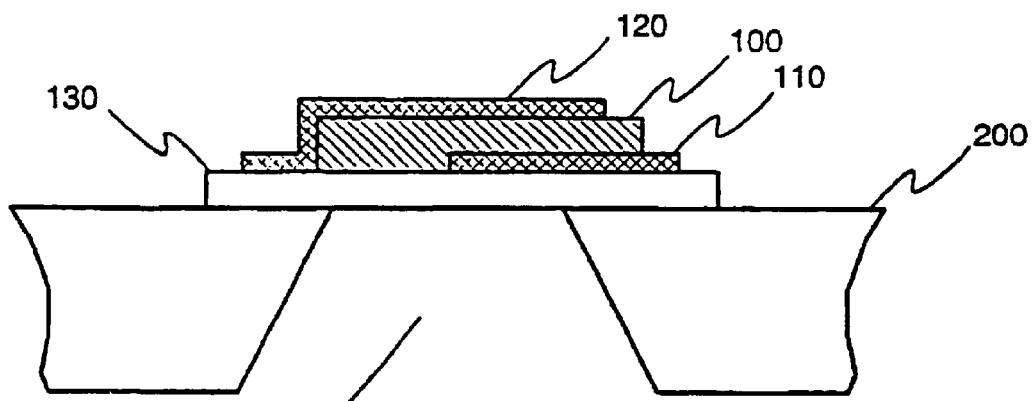
FIG. 3 illustrates a bulk acoustic wave resonator having a via-hole structure.
Figure 4:
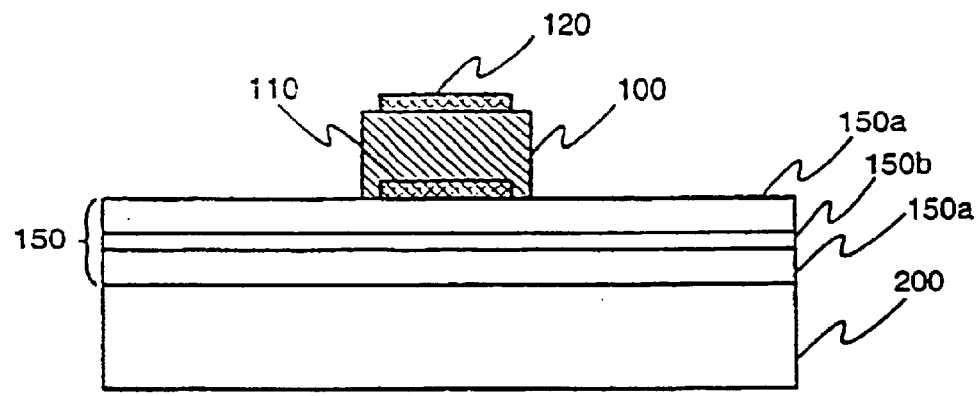
FIG. 4 illustrates a bulk acoustic wave resonator isolated from the substrate by an acoustic mirror structure.
Figure 5:
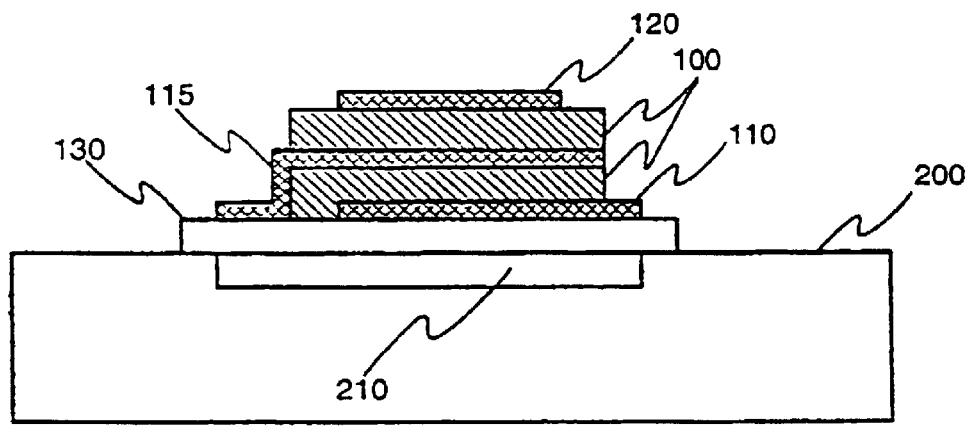
FIG. 5 illustrates a stacked bulk acoustic wave resonator.

Above in conjunction with the description of the prior art reference was made to FIGS. 1–5. The same reference numerals are used for corresponding parts in the figures.

Figure 6:
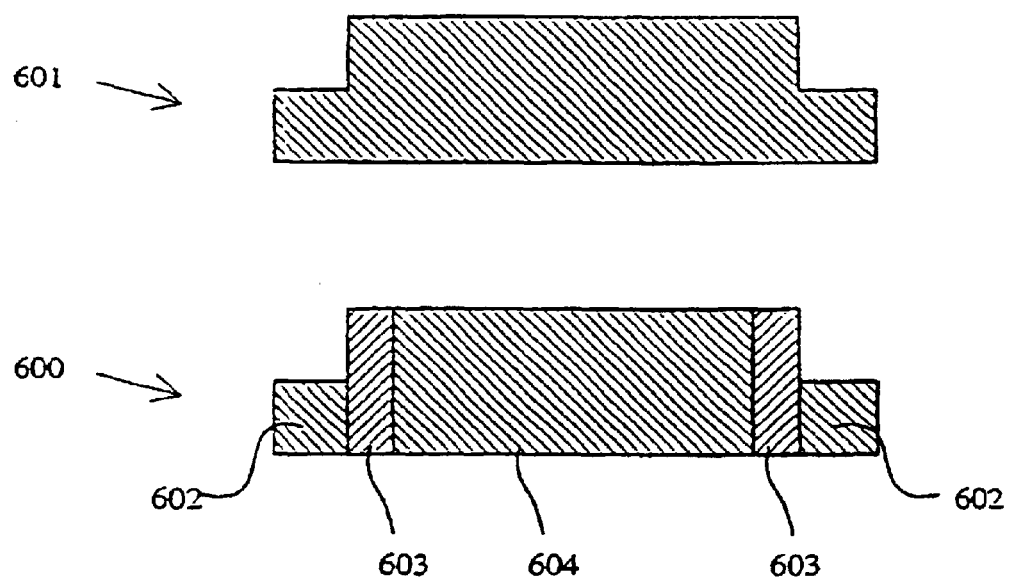
FIG. 6 illustrates schematically a cross-section of an exemplary resonator structure according to a first preferred embodiment of the invention and a cross-section of a corresponding prior-art resonator structure.

The dampening effect can be demonstrated by studying the resonance modes of two resonator structures 600 and 601. The cross-sections of the resonator structures 600 and 601 are presented in FIG. 6. The 220 $\mu$m wide piezoelectrically excitable area of the resonator structures 600 and 601 is the thicker area (marked with reference numbers 603, 604 in resonator structure 600) in the middle of the resonator structures 600 and 601. The resonator structure 600 is an example of a resonator structure according to a first preferred embodiment of the invention, and it comprises a 10 $\mu$m wide dampening frame-like zone 603 at the edge of the piezoelectrically excitable area, within the piezoelectrically excitable area. The center area 604 of the resonator structure 601 according to a first preferred embodiment of the invention is also presented in FIG. 6.

The resonance frequencies of the structures are calculated, for example using FEM.

When the resonance frequencies are calculated, the different acoustical dampening at the various regions of the structure can be taken into account by using a quality factor Q. The quality factor can be defined separately for each region. A large quality factor refers to small energy losses (losses are caused by the transformation of vibrational energy to heat), and small Q factor refers to large energy losses. The resonator structure 600 is studied by assuming that the quality factor Q has value 1000 in the regions where there is no additional damping (i.e. region 602 and center area 604), and Q=50 in the 10 $\mu$m wide zone 603 at the edge of the piezoelectrically excitable area These values of Q have no special meaning, they merely express the difference in the assumed damping properties at the various regions of the resonator structure. The cut-off frequencies relating to the piezoelectrically excited wave in the various regions is illustrated as thickness in the vertical direction in FIG. 6. The cut-off frequency in region 603 is the same as that in the region 604, i.e. the dampening frame-like zone simulated here differs from the center area only by its stronger attenuation properties.

Figure 7:
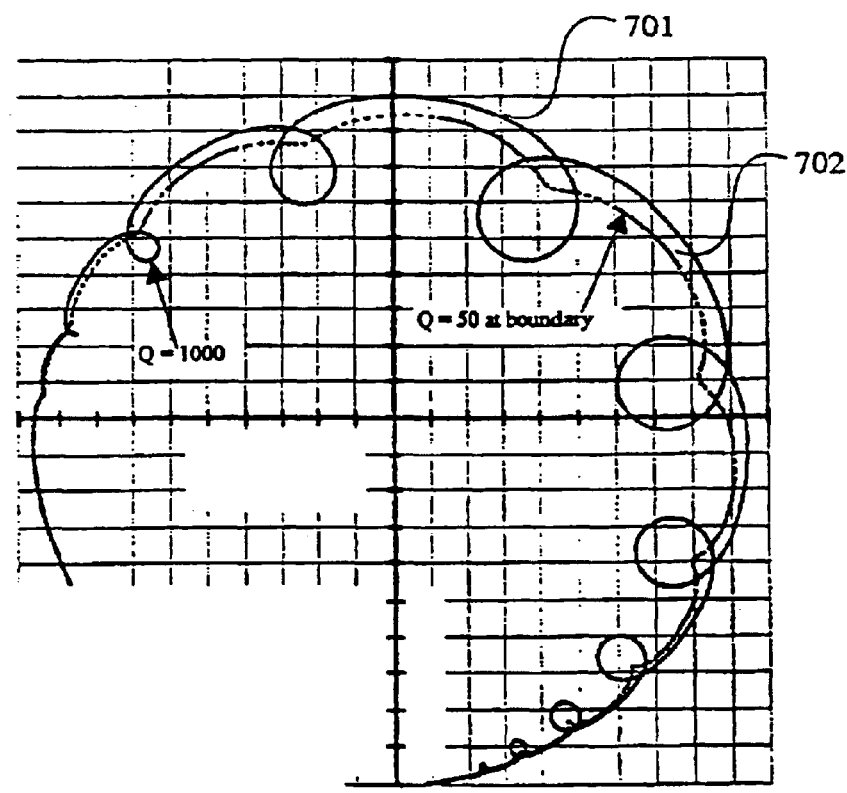
FIG. 7 shows a calculated response of a resonator structure according to the preferred embodiment of the invention on Smith's chart.

Once the mechanical resonance modes are calculated and the piezoelectric effect is taken into account (either directly in the calculation or using different techniques), it is possible to present the behavior of the resonator structures using a Smith's chart. FIG. 7 presents the results of two simulations on a Smith's chart. When calculating Smith's chart in FIG. 7, the impedance of the BAW resonators has been compared to a typical 50 Ω impedance. In Smith's chart, frequency increases in a clockwise manner. A resonator which resonates only in the basic resonance mode produces a circle on Smith's chart. Possible loops in the diagram indicate spurious resonance frequencies.

The solid line 701 in FIG. 7 represents the response of the state-of-the-art, prior-art BAW resonator where there is no dampening zone around a center area, and the loops indicating spurious resonance modes can be clearly seen. The dashed line 702 presents the response of the resonator structure where there is a frame-like dampening zone. The dashed line resembles a circle and there are no loops. The loops have been suppressed to slight dents.

The dashed line in the Smith's chart indicates that a frame-like zone around the piezoelectrically excitable area enhances the performance of a resonator structure. The dashed line is somewhat closer to the center of the chart than the solid lines. This means that also the basic resonance mode is slightly dampened, but the dampening is not very strong.

The dampening zone can be constructed, for example, by depositing a layer of a lossy film, which layer has an opening defining the center area within the piezoelectrically excitable area, in the resonator structure. The lossy film may be, for example, polymer film. In this simulation the dampening zone around the center area of the resonator has only different attenuation properties than the rest of the piezoelectrically excitable area. If a thick dampening layer, which has an opening within the piezoelectrically excitable area, overlaps an otherwise practically uniform piezoelectrically excitable area, the cut-off frequency relating to a piezoelectrically excitable wave is typically different in the center area than in edge of the piezoelectrically excitable area, where the dampening zone is present This may further enhance the electrical properties of a resonator according to the invention.

Figure 8C:
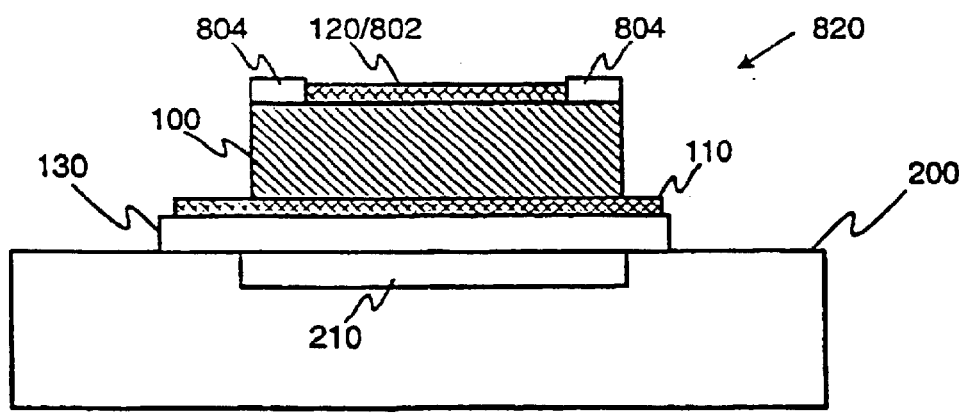
FIG. 8 shows schematically cross-sections of exemplary resonator structures according to a second and third preferred embodiments of the invention.
Figure 8A:
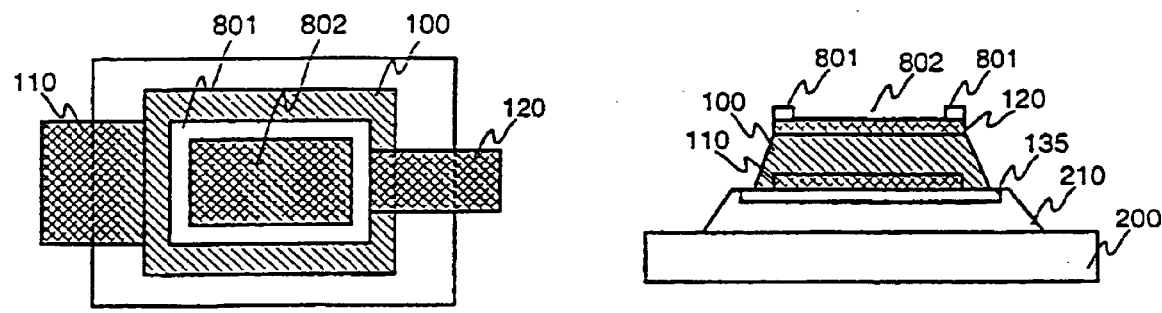
Figure 8A:
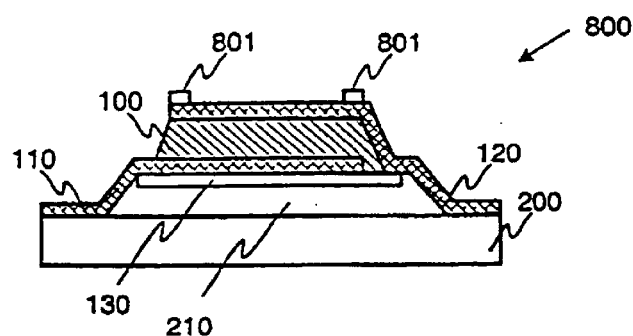

FIG. 8a presents schematically a cross-section of a resonator structure 800 as an example of a resonator structure according to a second preferred embodiment of the invention. In the resonator structure 800 there is a piezoelectrical layer 100, a bottom electrode 110 and a top electrode 120 on a substrate 200. Possible membrane, gap or mirror structure between the substrate 200 and the bottom electrode 110 are not shown in FIG. 8. Furthermore, the resonator structure 800 comprises a frame-like layer 801 of dampening material on top of the top electrode 120. The frame-like layer 801 may be placed, alternatively, somewhere between the electrode layers, for example. The opening 802 in the frame-like layer 801 defines the center area of resonator structure 800. It is possible that a frame-like dampening layer is so wide that it extends over the edges of a top electrode or, in other words, over the edges of the piezoelectrically excitable area of a resonator.

Figure 8B:
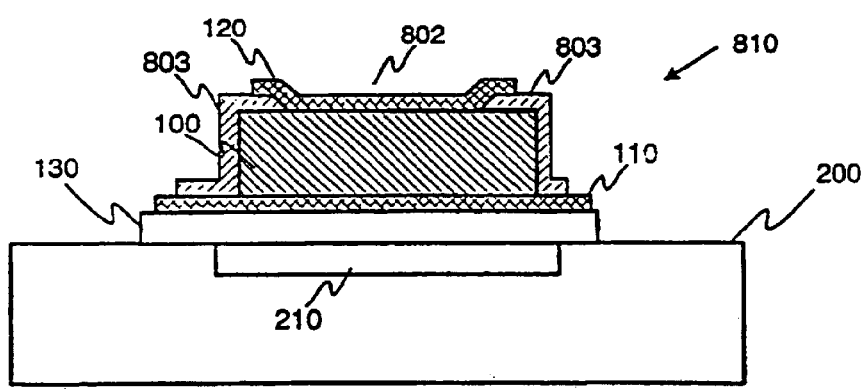

FIG. 8b presents schematically a cross-section of a resonator structure 810 according to a third preferred embodiment of the invention. The resonator structure 810 is otherwise similar to the resonator structure 800, but in resonator structure 810 there is, instead of a frame-like dampening layer 801 extending only to the piezoelectrically excitable area, a dampening layer 803 which extends over the edges of the piezoelectric layer 100, covering the exposed piezoelectric material not covered by the top electrode, and which is, for example, between the top electrode 120 and the piezoelectric layer 100. Also in this case the dampening layer 803 has an opening 802 within the piezoelectrically excitable area. The opening 803 defines the center area of resonator structure 810. Some piezoelectric material require protection from moisture or humidity, and the layer 803 may, for example, in addition to being a damping layer, perform as a protection layer. Conventional passivation layers are typically made of $SiO_2$ or $Si_3N_4$, which do not dampen vibrations effectively.

FIG. 8c illustrates schematically a cross-section of a resonator structure 820 according to a fourth preferred embodiment of the invention. In resonator structure 820 there is a frame-like layer 804, which encircles the piezoelectrically excitable area without substantially overlapping the piezoelectrically excitable area and which is made of material attenuating vibrations. The center area of this resonator 820 is the piezoelectrically excitable area of the resonator.

BAW resonators presented in FIG. 8 may be, for example, resonators having an Au bottom electrode, a ZnO or AlN piezoelectric layer and an Al top electrode. Alternatively, any other suitable materials may be used for the electrodes and piezoelectric layer(s) in resonators according to the invention. For example, materials discussed in connection with prior-art BAW resonators may be used. The dampening layer may be, for example, polyimide. For a BAW resonator having a resonance frequency about 1 GHz, the thickness of an Au bottom electrode is typically 200–500 nm, the thickness of an Al top electrode is typically about 400–600 nm and the thickness of a ZnO piezoelectric layer is about 2 $\mu$m. If AlN is used, the thickness of an AlN piezoelectric layer is about 3 $\mu$m at 1 GHz. As is well-known in the art, the resonance frequency depends on the thickness and material of all layers in the resonator structure. The thickness of the dampening layer is typically of the same order than that of the top electrode. An appropriate width for the dampening layer or an appropriate shape and size for the opening in the dampening layer can be found, for example, experimentally.

The BAW resonators presented in FIG. 8 are, as an example, on membrane 130, below which there is a gap 210 in the substrate 200. Alternatively, a resonator according to the invention may have, for example, a bridge structure, an in-hole structure or an acoustic mirror. It is possible that a resonator according to the invention has more than one piezoelectric layers between the top and bottom electrodes, similarly as presented in FIG. 5.

BAW resonators are used here as an example of piezoelectric resonators, where a dampening zone at the edge of the piezoelectrically excitable area enhances the properties of the resonator. The invention is not restricted to BAW resonator, and may be used to enhance the properties of crystal resonators, too.

The expressions indicating directions, such as top and bottom electrodes, refer to the position of an electrode compared to the substrate. A top electrode is on the opposite side of the piezoelectric layer as the substrate, and the bottom electrode is on the same side of the piezoelectric layer as the substrate. These and any other possible expressions indicating directions are used to make the description of the resonator structure more eligible. These expressions do not restrict the resonator structures according to the invention in any way.

What is claimed is:

1. A resonator structure (600, 800, 810, 820) comprising two conductor layers (110, 120) and a piezoelectric layer (100) in between the conductor layers, said resonator having a first area over which said conductor layers and said piezoelectric layer extend, which first area is a piezoelectrically excitable area of the resonator structure, characterized in that the resonator structure further comprises at least one layer (801, 803, 804) of dampening material located between one of the conductor layers and the piezoelectric layer, said material dampening vibrations effectively, said at least one layer covering a zone and having an opening (802) in the first area, said opening uncovering at most the first area and confining a center area (604, 802) in the first area, and wherein piezoelectrically excited vibrations are dampened more effectively in the zone than in the center area.

2. A resonator according to claim 1, characterized in that it further comprises a second piezoelectric layer in between the conductive layers and a conductor layer in between the piezoelectric layers.

3. A resonator structure according to claim 1, characterized in that the material, which dampens vibrations effectively, is polymeric material.

4. A resonator structure according to claim 3, characterized in that the material is polyimide.

5. A resonator structure according to claim 1, characterized in that the layer of material, which dampens vibrations effectively, is adjacent to one of the conductor layers.

6. A resonator structure (820) according to claim 1, characterized in that the zone (804) substantially confines the first area.

7. A resonator structure (810) according to claim 1, characterized in that the layer of material, which dampens vibrations effectively, extends at least over the part of the piezoelectric layer, which is not within the first area.

8. A resonator structure (800) according to claim 1, characterized in that the zone (801) is within the first area.

9. A resonator structure (810) according to claim 1, characterized in that the zone (803) is at least partly outside the first area.

10. A filter comprising at least one resonator structure which comprises two conductor layers (110, 120) and a piezoelectric layer (100) in between the conductor layers, said resonator structure having a first area over which said conductor layers and said piezoelectric extend, which first area is a piezoelectrically excitable area of the resonator structure, characterized in that the resonator structure further comprises at least one layer (801, 803, 804) of dampening material located between one of the conductor layers and the piezoelectric layer, said material dampening vibrations effectively, said at least one layer covering a zone and having an opening (802) in the first area, said opening uncovering at most the first area and confining a center area (604, 802) in the first area, and wherein piezoelectrically excited vibrations are dampened more effectively in the zone than in the center area.

* * * * *